United States Patent
Sinclair

(10) Patent No.: US 9,690,491 B2
(45) Date of Patent: Jun. 27, 2017

(54) SYSTEM AND METHOD FOR MANAGING DATA IN A MEMORY DEVICE

(71) Applicant: SanDisk Technologies Inc., Plano, TX (US)

(72) Inventor: Alan Welsh Sinclair, Falkirk (GB)

(73) Assignee: SanDisk Technologies LLC, Plano, TX (US)

( * ) Notice: Subject to any disclaimer, the term of this patent is extended or adjusted under 35 U.S.C. 154(b) by 22 days.

(21) Appl. No.: 14/573,949

(22) Filed: Dec. 17, 2014

(65) Prior Publication Data

US 2016/0179371 A1    Jun. 23, 2016

(51) Int. Cl.
| | |
|---|---|
| G06F 3/06 | (2006.01) |
| G06F 12/02 | (2006.01) |
| G06F 11/10 | (2006.01) |
| G11C 29/02 | (2006.01) |

(52) U.S. Cl.
CPC .............. *G06F 3/061* (2013.01); *G06F 3/064* (2013.01); *G06F 3/0688* (2013.01); *G06F 11/1072* (2013.01); *G06F 12/0246* (2013.01); *G11C 29/028* (2013.01); *G06F 2212/7201* (2013.01)

(58) Field of Classification Search
CPC ........ G06F 3/061; G06F 3/064; G06F 3/0688; G06F 12/0246; G06F 2212/7201; G06F 11/1072
See application file for complete search history.

(56) References Cited

U.S. PATENT DOCUMENTS

| | | | |
|---|---|---|---|
| 8,239,639 B2 | 8/2012 | Sinclair | |
| 8,261,009 B2 | 9/2012 | Freikorn | |
| 8,537,613 B2 | 9/2013 | Sinclair et al. | |
| 8,677,054 B1 * | 3/2014 | Meir .................... | G06F 12/0246 707/817 |
| 9,348,746 B2 * | 5/2016 | Sinclair ............... | G06F 12/0246 |
| 9,465,731 B2 * | 10/2016 | Sinclair ............... | G06F 12/0246 |

(Continued)

OTHER PUBLICATIONS

Office Action dated Jun. 21, 2016 for co-pending U.S. Appl. No. 14/573,959 (26 pages).

(Continued)

*Primary Examiner* — Aracelis Ruiz
(74) *Attorney, Agent, or Firm* — Brinks Gilson & Lione

(57) ABSTRACT

A non-volatile memory system may have a group of non-volatile memory cells having a plurality of predetermined portions, where each predetermined portion is associated with an open host write block of a different host data type than each other predetermined portion. A host data router directs received data from a host to an appropriate predetermined portion based on a determined data type. A maintenance data router, based on predetermined minimum capacity overprovisioning targets for each predetermined portion, operates to adjust an amount of overprovisioning of physical capacity among the plurality of predetermined portions to reduce write amplification and increase performance in predetermined portions having data with a higher probability of host update. The method may include selecting a particular predetermined portion and a particular block within the selected predetermined portion on which to perform a maintenance operation to achieve the desired capacity overprovisioning.

17 Claims, 11 Drawing Sheets

(56) References Cited

U.S. PATENT DOCUMENTS

| | | |
|---|---|---|
| 2007/0186065 A1* | 8/2007 | Lee .................. G06F 3/0616 |
| | | 711/159 |
| 2008/0253217 A1 | 10/2008 | Taeuber et al. |
| 2010/0037009 A1* | 2/2010 | Yano ................ G06F 12/0246 |
| | | 711/103 |
| 2010/0122016 A1 | 5/2010 | Marotta et al. |
| 2011/0252215 A1 | 10/2011 | Franceschini et al. |
| 2011/0320684 A1 | 12/2011 | Gorobets et al. |
| 2012/0079167 A1* | 3/2012 | Yao ................... G06F 12/0246 |
| | | 711/103 |
| 2012/0246391 A1* | 9/2012 | Meir .................. G06F 12/0246 |
| | | 711/103 |
| 2012/0246443 A1* | 9/2012 | Meir ..................... G06F 12/06 |
| | | 711/209 |
| 2012/0250433 A1 | 10/2012 | Jeon |
| 2012/0254574 A1 | 10/2012 | Sinclair et al. |
| 2012/0297122 A1 | 11/2012 | Gorobets et al. |
| 2013/0067146 A1 | 3/2013 | Zettsu |
| 2014/0185376 A1 | 7/2014 | Sinclair et al. |
| 2014/0189205 A1 | 7/2014 | Sinclair et al. |
| 2014/0189206 A1 | 7/2014 | Sinclair et al. |
| 2014/0189207 A1 | 7/2014 | Sinclair et al. |
| 2014/0189208 A1 | 7/2014 | Sinclair et al. |
| 2014/0189209 A1 | 7/2014 | Sinclair et al. |
| 2014/0189210 A1 | 7/2014 | Sinclair et al. |
| 2014/0240335 A1* | 8/2014 | Hu .................... G06F 12/0246 |
| | | 345/543 |
| 2016/0179371 A1 | 6/2016 | Sinclair |

OTHER PUBLICATIONS

Notice of Allowance in copending U.S. Appl. No. 14/573,959 mailed Dec. 20, 2016.

\* cited by examiner

SYSTEM AND METHOD FOR MANAGING DATA IN A MEMORY DEVICE

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory is often made up of groups of memory cells referred to as pages, and multiple pages are often then organized in groups known as blocks. Flash memory cells may be physically configured to store data in different bit per cell levels. Binary flash, also known as single level cell (SLC) flash memory is configured to store 1 data bit per cell. Multi-level cell (MLC) flash memory may be configured to store 2 or more data bits per cell. Generally speaking, while higher density MLC memory can hold more data than SLC memory, the endurance and speed of flash memory tend to go down as the bit-per-cell level increases.

After data is written to a block in memory, some of that data may become obsolete over time when updated versions of that data are later written by a host to other blocks in the non-volatile memory, or when the host identifies certain data is now obsolete. At specified intervals, or in response to certain criteria being met, a non-volatile memory system may perform maintenance operations, such as garbage collection operations, to identify a block with valid and obsolete data and move the valid data remaining in the identified block to another block. The originally identified block may then be recycled for use by the memory system. In non-volatile memory systems where blocks of data with differing frequency of update are managed as a single population, obsolete data can become "trapped" in cold blocks which very rarely experience maintenance operations. When this happens, performance and endurance can suffer due to the greater burden on the remaining active blocks.

BRIEF SUMMARY

A system and method for managing data in multiple predetermined portions, also referred to herein as stratums, of an independently managed non-volatile memory set in a non-volatile memory system is disclosed, where capacity overprovisioning may be maintained at different levels in each stratum to benefit non-volatile memory system performance.

According to a first aspect, a method for managing maintenance procedures on different data types in a non-volatile memory is disclosed. The method includes receiving data from a host and identifying which of a plurality of data types the received data is associated with based on data type information received from the host. The method includes storing the received data in a predetermined portion of an independently managed non-volatile memory set, the independently managed non-volatile memory set having a group of non-volatile memory cells of a same storage density, where the group of non-volatile memory cells includes a plurality of predetermined portions, each of the predetermined portions having an open host write block associated with only a respective one of a plurality of different host data types. The method continues with the detection of a maintenance operation trigger and, in response to detecting the maintenance operation trigger, selecting one of the plurality of predetermined portions in which to execute a maintenance operation based on a respective physical capacity overprovisioning criteria associated with each of the plurality of predetermined portions. The maintenance operation is executed on a block of the selected predetermined portion to adjust physical overprovisioning of the selected predetermined portion to meet at least a minimum physical overprovisioning criteria for the selected predetermined portion.

In another aspect a non-volatile memory system is disclosed. The non-volatile memory system may include an independently managed non-volatile memory set having a plurality of predetermined portions in a layer of the independently managed non-volatile memory set, where the layer comprises blocks of memory cells having a same bit per cell storage capacity and each predetermined portion is defined by an open host write block exclusively associated with a data type that differs from each other of the plurality of predetermined portions. The non-volatile memory system may also include a host data router configured to route host data to one of the plurality of predetermined portions based on the data type of the data received from the host. The non-volatile memory system may further include a maintenance data router in communication with the plurality of predetermined portions, the maintenance data router configured to adjust current physical capacity overprovisioning in at least one predetermined portion in response to detecting a maintenance trigger event, wherein capacity overprovisioning comprises a relation of a current physical data storage capacity associated with a particular predetermined portion to a current amount of valid data associated with the particular predetermined portion.

According to yet another aspect, A non-volatile memory system is disclosed having an independently managed non-volatile memory set with a plurality of predetermined portions in a single group of the non-volatile memory, where the single group comprises blocks of memory cells having a same bit per cell storage capacity, and wherein each predetermined portion includes an open host write block exclusively associated with a data type that differs from a data type of an open host write block of each other of the plurality of predetermined portions. The system may also include a host data router configured to identify a data type of host data and route host data having the identified data type to a host data subportion in one of the plurality of predetermined portions having an open host write block exclusively associated with the identified data type. A maintenance data router is included having a first mode wherein the maintenance data router is configured to move data from the host data subportion to a maintenance data subportion in a same predetermined portion, and a second mode, wherein the maintenance data router is configured to move data from a maintenance data subportion in a first predetermined portion to a maintenance data subportion in a second predetermined portion associated with a data type of data having a lower probability of update.

The above aspects are not intended to be limiting and set forth some of the many aspects contemplated. Additional aspects of the above method and system are described below.

DETAILED DESCRIPTION

Figure 1A:
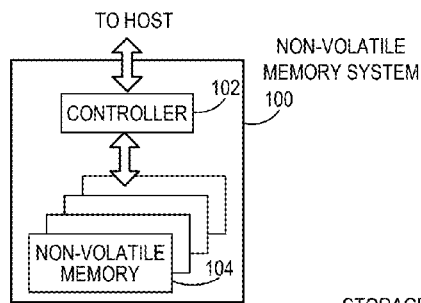
FIG. 1A is a block diagram of an example non-volatile memory system.

The present disclosure is directed to systems and methods for independently managing populations of blocks in a layer of a non-volatile memory device to reduce write amplification for more frequently updated data. The memory systems undergo write/erase operations due to both host writes and the memory maintenance operations that take place in the normal life span of a memory system. The internal memory maintenance (i.e., non-host write operations or background operations) can introduce a high write amplification factor ("WAF") for MLC and SLC memory cells. WAF may be understood to be the relation between the amount of data a non-volatile memory system has to write (including any internal copying of data from one block to another) to execute a host write operation to the actual amount of data that the host sends to be written to the non-volatile memory system for the write operation. In other words, WAF is the ratio of total write operations compared with writes from host. As one example, a significant number of MLC write/erase operations may be due to these internal memory operations. This may have a significant effect on the life and performance of the non-volatile memory system.

As discussed in greater detail below, embodiments of this disclosure include creating populations of blocks in the non-volatile memory system that are referred to as stratums, or predetermined portions of an independently managed non-volatile memory set. A stratum is defined herein as a population of blocks of data that include an open host write block for exclusively receiving data of a predetermined data type from a host, an open relocation block for receiving data of the same or a different predetermined data type from the same or a different stratum rather than from the host, and a collection closed blocks for the stratum, where the collection of closed blocks for the stratum is exclusively made up of the formerly open write blocks and formerly open relocation blocks for the stratum that have been fully programmed. The embodiments described herein include memory systems having multiple stratums. Each of the multiple stratums is configured to receive a different type of data from the host. Thus, although each different stratum may be defined by an open write block for receiving data of a different predetermined data type from the host, the open relocation block and the closed write blocks and relocation blocks for the stratum may include data of different data types over time as data is relocated between stratums as a result of maintenance operations, such as relocation or garbage collection, as discussed in greater detail below.

Each stratum may be assigned a different predetermined minimum physical capacity overprovisioning to reduce write amplification problems and improve endurance and the non-volatile memory system operates to maintain at least the respective minimum overprovisioning level for each respective stratum. Minimum physical capacity overprovisioning of a stratum is the amount of physical capacity allocated to the stratum in excess of the amount of physical capacity required to store data for the specified logical capacity of the stratum. Overprovisioned capacity may contain data that has been made obsolete when the host updated data for the same LBA or deleted data for the LBA using a TRIM command. Increasing overprovisioned capacity may increase the performance within a stratum by allowing accumulation of obsolete data in blocks within the stratum, and reducing the amount of valid data that has to be relocated during maintenance operations to reclaim a block.

Figure 1B:
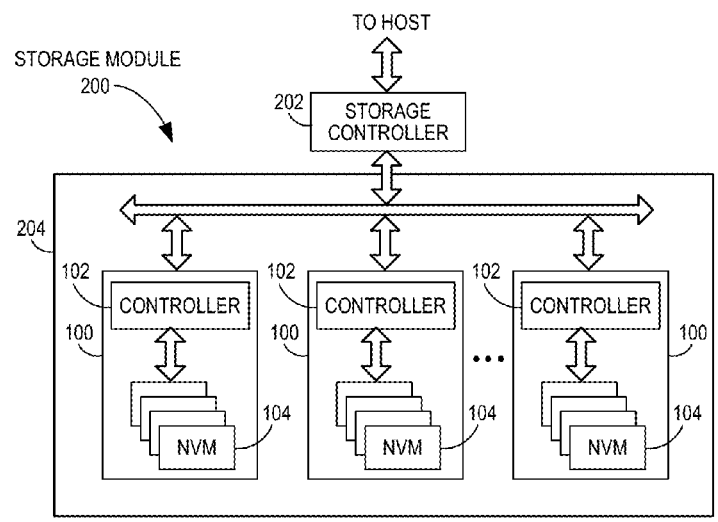
FIG. 1B is a block diagram illustrating an exemplary storage module.
Figure 1C:
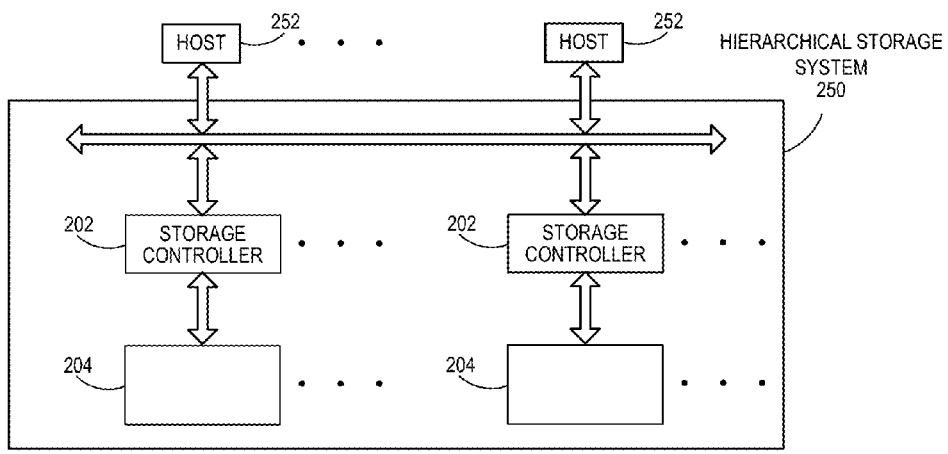
FIG. 1C is a block diagram illustrating a hierarchical storage system.

Memory systems suitable for use in implementing aspects of these embodiments are shown in FIGS. 1A-1C. FIG. 1A is a block diagram illustrating a non-volatile memory system according to an implementation of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate.

The controller 102 (which may be a flash memory controller) can take the form of processing circuitry, a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a non-volatile memory express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
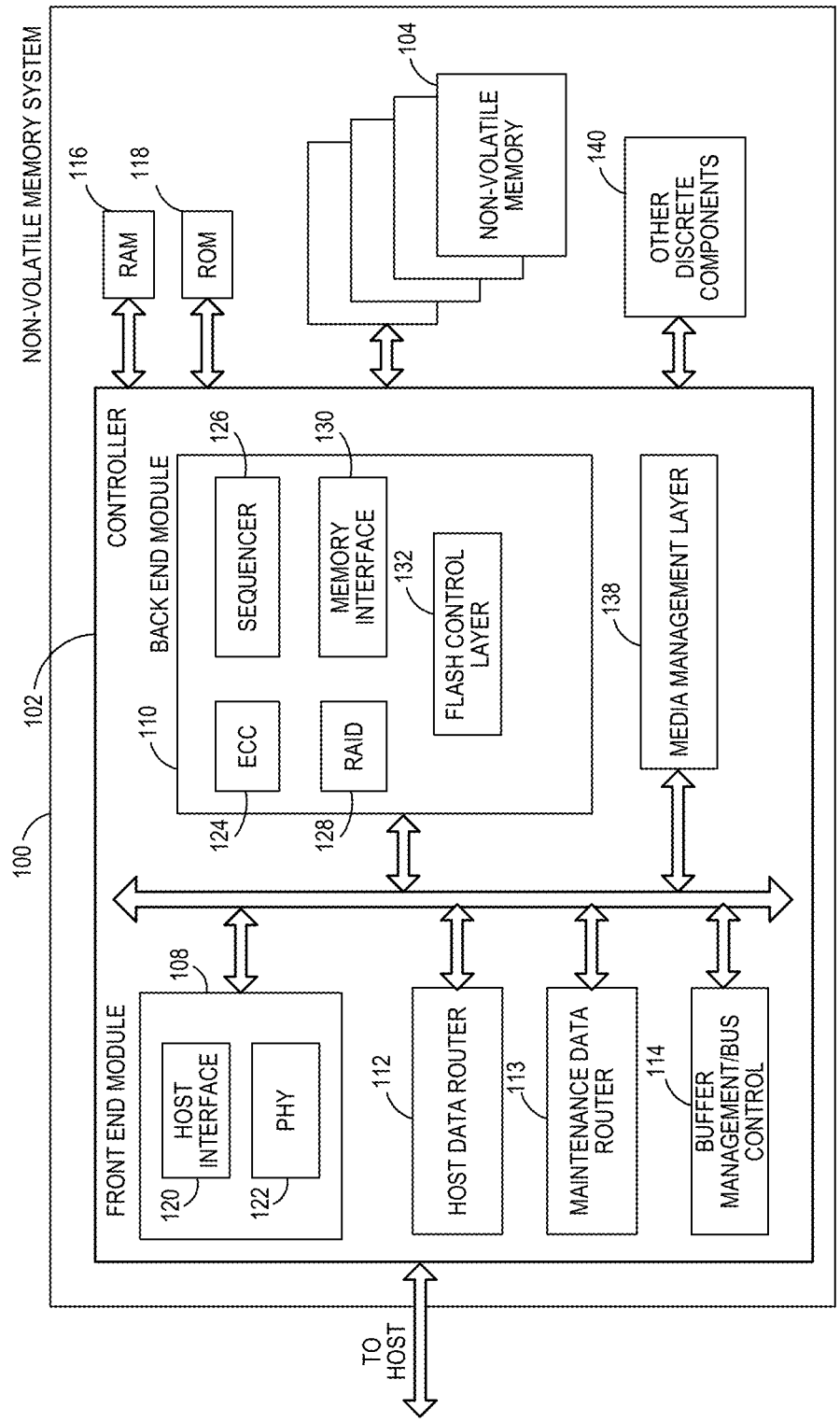
FIG. 2A is a block diagram illustrating exemplary components of a controller of the non-volatile memory system illustrated in FIG. 1A.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a host data router module 112 and a maintenance data router module 113. Each performs data routing functions into or between portions of the non-volatile memory 104 for controller 102. The host data router module 112 may direct data received from a host to a particular stratum based on data type information received from the host, while the maintenance data router module 113 may move data between blocks in a stratum or between stratums based on a desired capacity overprovisioning for each stratum as described in greater detail below. Although in some implementations the host data router module 112 and maintenance data router module 113 are each part of the controller 102 as described above, in other implementations, all or a portion of a these modules may be discrete components, separate from the controller 102, that interface with the controller 102.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and/or ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
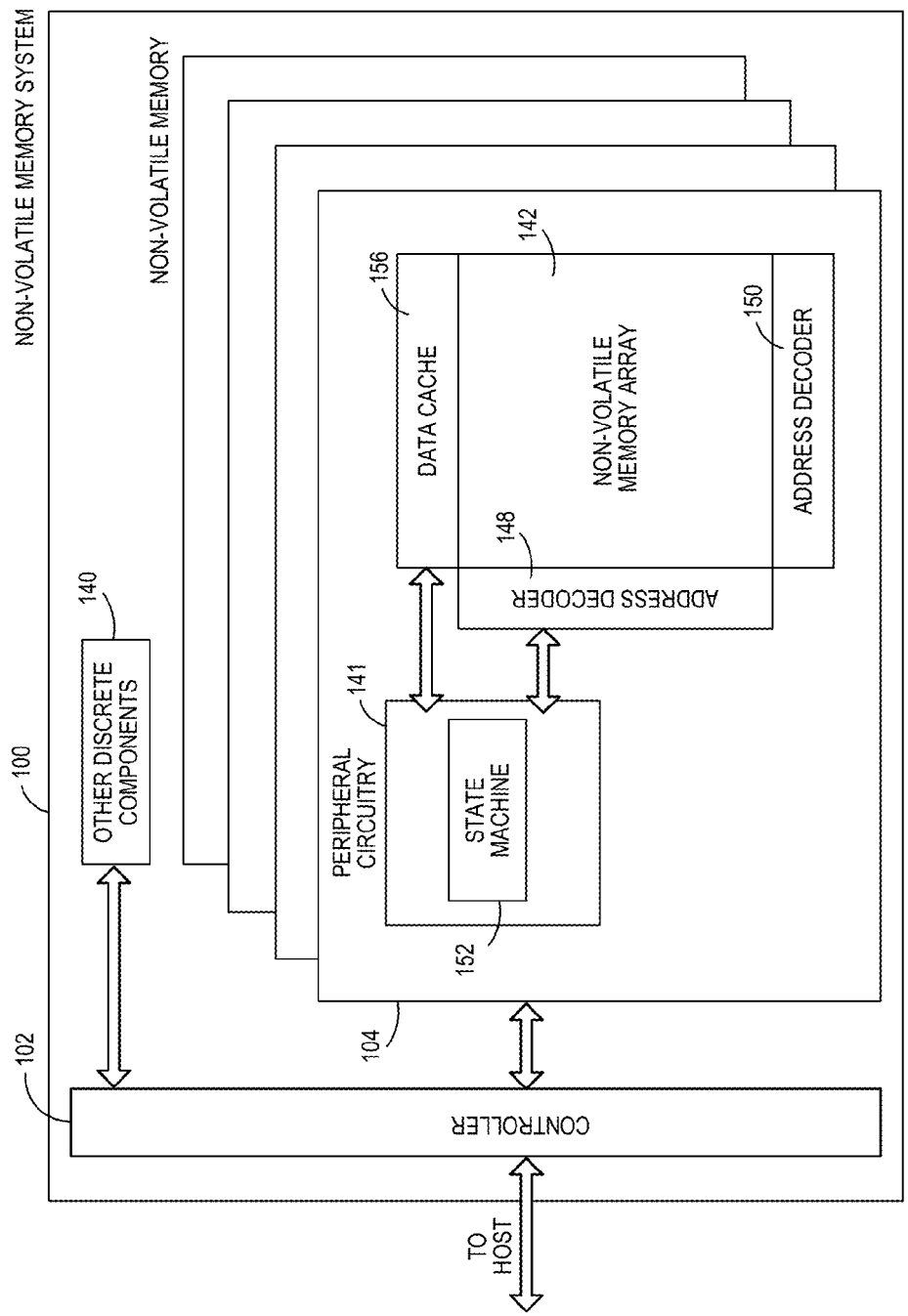
FIG. 2B is a block diagram illustrating exemplary components of the non-volatile memory of the non-volatile memory storage system illustrated in FIG. 1A.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

The controller 102 may be implemented in a single integrated circuit chip and may communicate with the different layers in the non-volatile memory die 104 over one or more command channels. As used herein, the term die refers to the set of non-volatile memory cells, and associated circuitry for managing the physical operation of those non-volatile memory cells, that are formed on a single semiconductor substrate. A layer which, in different embodiments of an independently managed set, may be in a memory die or span across multiple non-volatile memory die, is defined herein as a group of blocks configured to store data in a particular bit-per-cell capacity, where each layer has a different bit-per-cell capacity than each other layer. Controller executable code for implementing memory management instructions such as described herein may be stored in the non-volatile flash memory.

Figure 3:
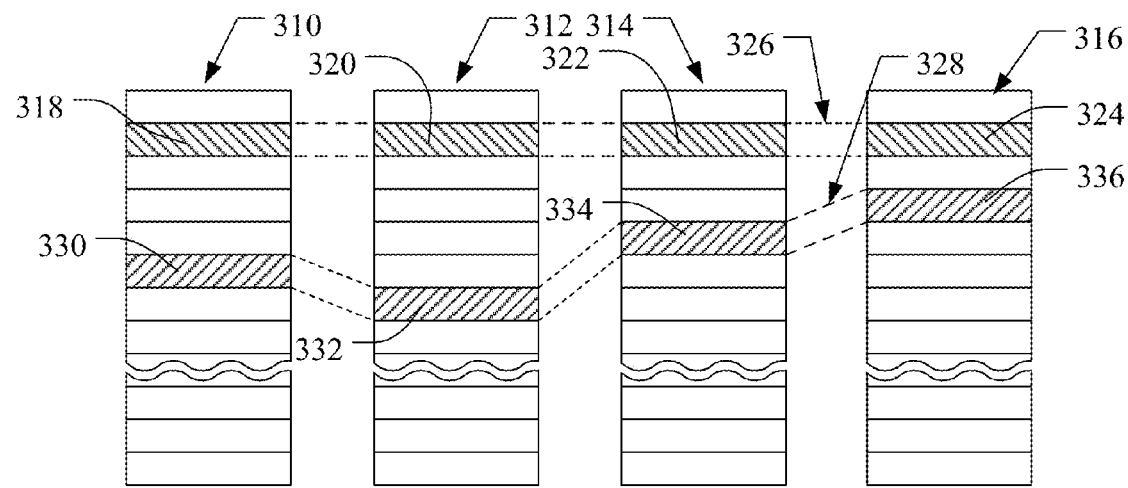
FIG. 3 illustrates an example physical memory organization of the non-volatile memory system of FIG. 1A.

The non-volatile flash memory array 142 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 3, a conceptual illustration of a representative flash memory cell array is shown. Four planes or sub-arrays 310, 312, 314 and 316 of memory cells may be on a single integrated memory cell chip, on two chips (two of the planes on each chip) or on four separate chips. Other numbers of planes may exist in a system. The planes are individually divided into blocks of memory cells shown in FIG. 3 by rectangles, such as blocks 318, 320, 322 and 324, located in respective planes 310, 312, 314 and 316. There may be dozens or hundreds of blocks in each plane. Blocks may be logically linked together to form a metablock that may be erased as a single unit. For example, blocks 318, 320, 322 and 324 may form a first metablock 326. The blocks used to form a metablock need not be restricted to the same relative locations within their respective planes, as is shown in the second metablock 328 made up of blocks 330, 332, 334 and 336.

Figure 4:
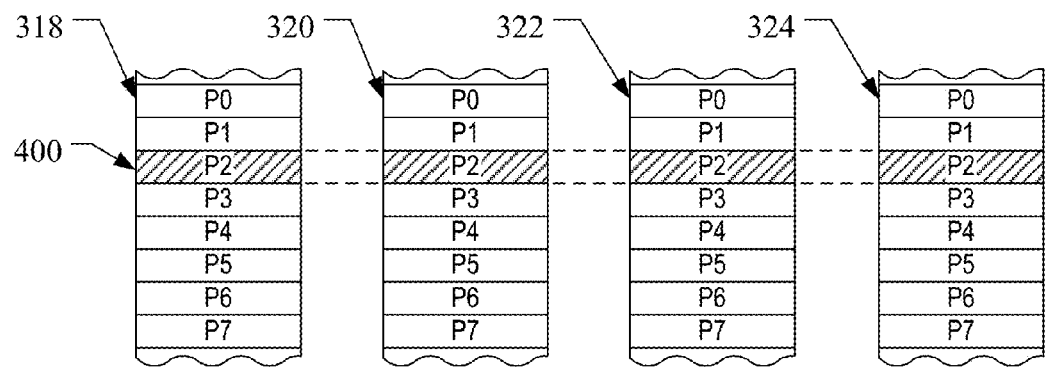
FIG. 4 shows an expanded view of a portion of the physical memory of FIG. 3.

The individual blocks are in turn divided for operational purposes into pages of memory cells, as illustrated in FIG. 4. The memory cells of each of blocks 318, 320, 322, and 324, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 400 is illustrated in FIG. 4 as formed of one physical page for each of the four blocks 318, 320, 322 and 324. The metapage 400 includes the page P2 in each of the four blocks but the pages of a metapage need not necessarily have the same relative position within each of the blocks. A metapage is the maximum unit of programming. The blocks disclosed in FIGS. 3-4 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host. The LBAs are then mapped to one or more physical blocks in the storage device 102 where the data is physically stored.

Figure 5A:
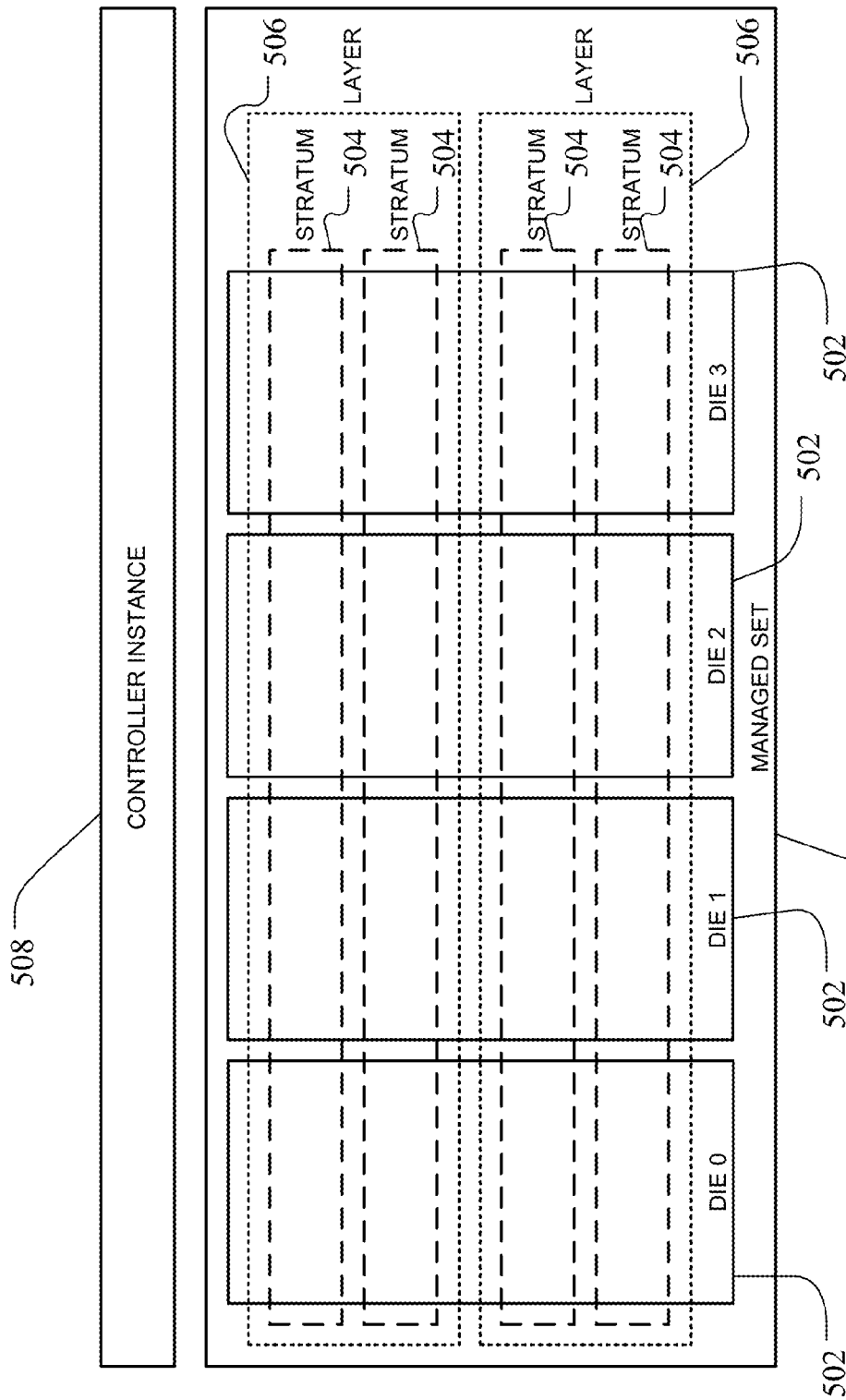
FIG. 5A illustrates an embodiment of the non-volatile memory system of FIG. 2B where the non-volatile memory is a single independently managed non-volatile memory set made up of multiple non-volatile memory die, and where the independently managed set includes multiple stratums in one or more layers of the independently managed set.
Figure 5B:
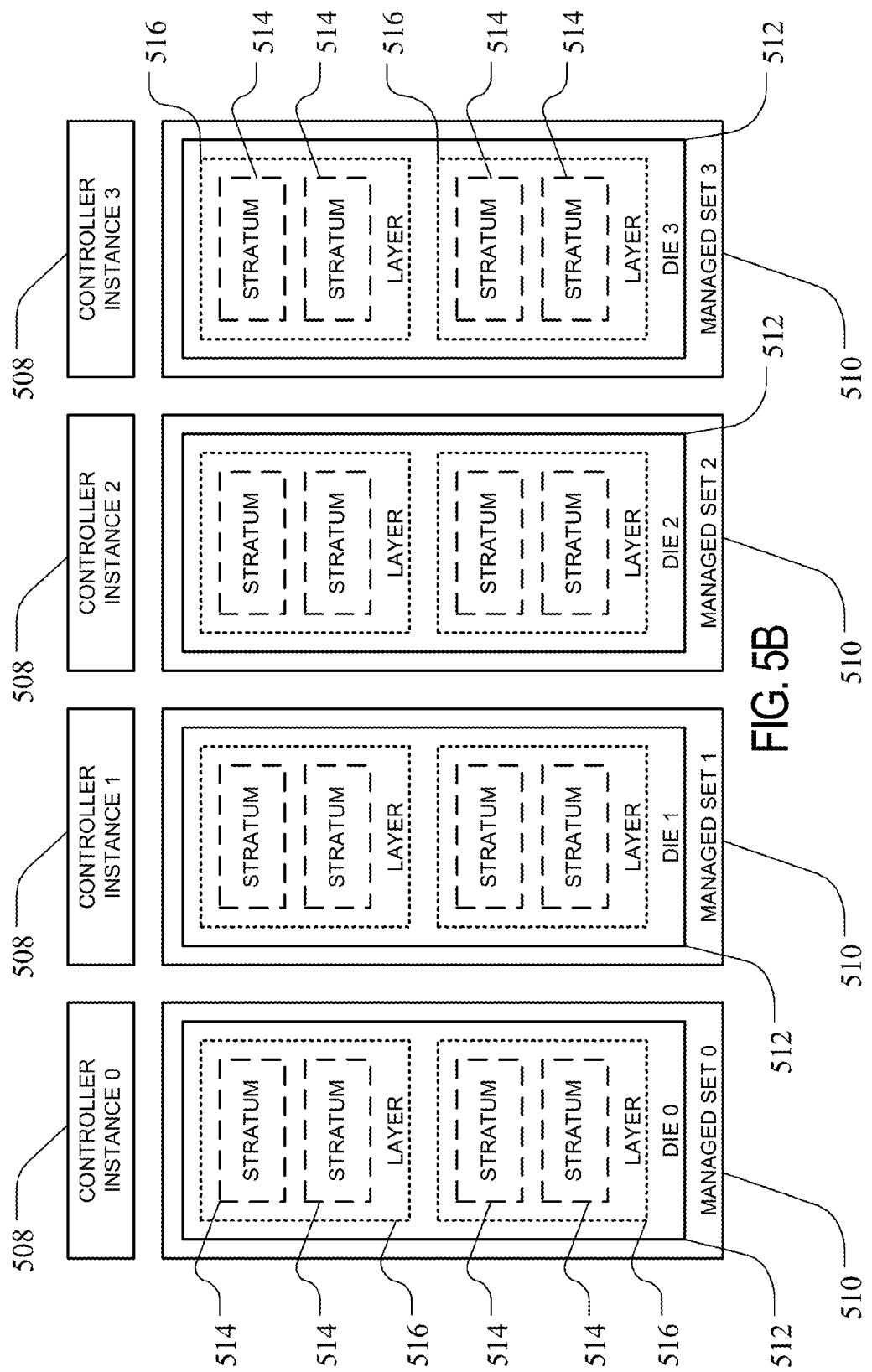
FIG. 5B illustrates an alternative arrangement of the non-volatile memory of FIG. 5A, where the non-volatile memory includes multiple independently managed non-volatile memory sets each made up of a single non-volatile memory die.

Referring now to FIGS. 5A and 5B, the non-volatile memory system 100 (FIG. 1A) may include one or more independently managed non-volatile memory sets 500 of non-volatile memory cells, where each independently managed set 500 may include an integer number of one or more non-volatile memory die 104. Each independently managed set is in communication with, and controlled by, a separate controller instance 508. Each controller instance may be a separate physical controller or circuit 102, a separate software or firmware thread running on a physical controller or circuit, or any other arrangement of hardware and/or software that may manage each independently managed set 500, 510 independently and asynchronously of any other independently managed set in the non-volatile memory system 100.

Referring to FIG. 5A, one implementation of stratums 504 is shown for an independently managed set 500 consisting of multiple die 502, which may each be configured as illustrated in non-volatile memory die 104. Each stratum 504, as noted above, is a population of blocks of data that include an open host write block for exclusively receiving data of a predetermined data type from a host, an open relocation block for receiving data of the same or a different predetermined data type from the same or a different stratum rather than from the host, and a collection closed blocks made up of the formerly open write blocks and formerly open relocation blocks for the stratum 504 that have been fully programmed. In the embodiment of FIG. 5A, each stratum 504 includes all blocks or metablocks as defined above for that particular stratum in a layer 506 of the independently managed set in the non-volatile memory system 102. Each layer 506 is made up of blocks having a same cell capacity in the independently managed set 500, in terms of bit-percell capacity. Thus, if each non-volatile memory die 502 in an independently managed set 500 included one, two and three bit-per-cell capacity cells (also referred to as X1, X2 and X3 cells, respectively) then the independently managed set 500 has three layers 506 where each layer 506 is made up of only one type of X1, X2 or X3 blocks of memory cells across all of the die 502 in the independently managed set 500. Two layers 506 are shown in FIG. 5A for ease of illustration.

In other embodiments, there may be only a single layer 506 or more than two layers 506 in an independently managed set 500. FIG. 5B illustrates multiple independently managed sets 510 each in communication with a separate controller instance 508, where each independently managed set 510 includes only a single die 512. As with the example of FIG. 5A, the independently managed sets 510 in FIG. 5B are shown with two layers 516 and two stratums 514 per layer 516. The number of die 502, 512 per independently managed set 500, 510, layers 506, 516 per independently managed set 500, 510, and stratums 504, 514 per layer 506, 516 may be greater than, or less than that shown in FIGS. 5A and 5B.

In one implementation, at least one layer having at least two stratums is contemplated for the techniques described in greater detail below. Thus, although FIGS. 5A and 5B show two stratums per layer, only one layer with multiple stratums are necessary for the techniques discussed herein. The techniques may be applied to a non-volatile memory system 100 with independently managed sets having a single layer with multiple stratums, in a multiple stratum layer of a non-volatile memory with multiple layers where only one layer includes multiple stratums, or in each layer having multiple stratums in an independently managed non-volatile memory set. The number of stratums 504, 514 in a layer 506, 516 is determined by the number of data type categories the non-volatile memory system 102 is predetermined to recognize.

Figure 6:
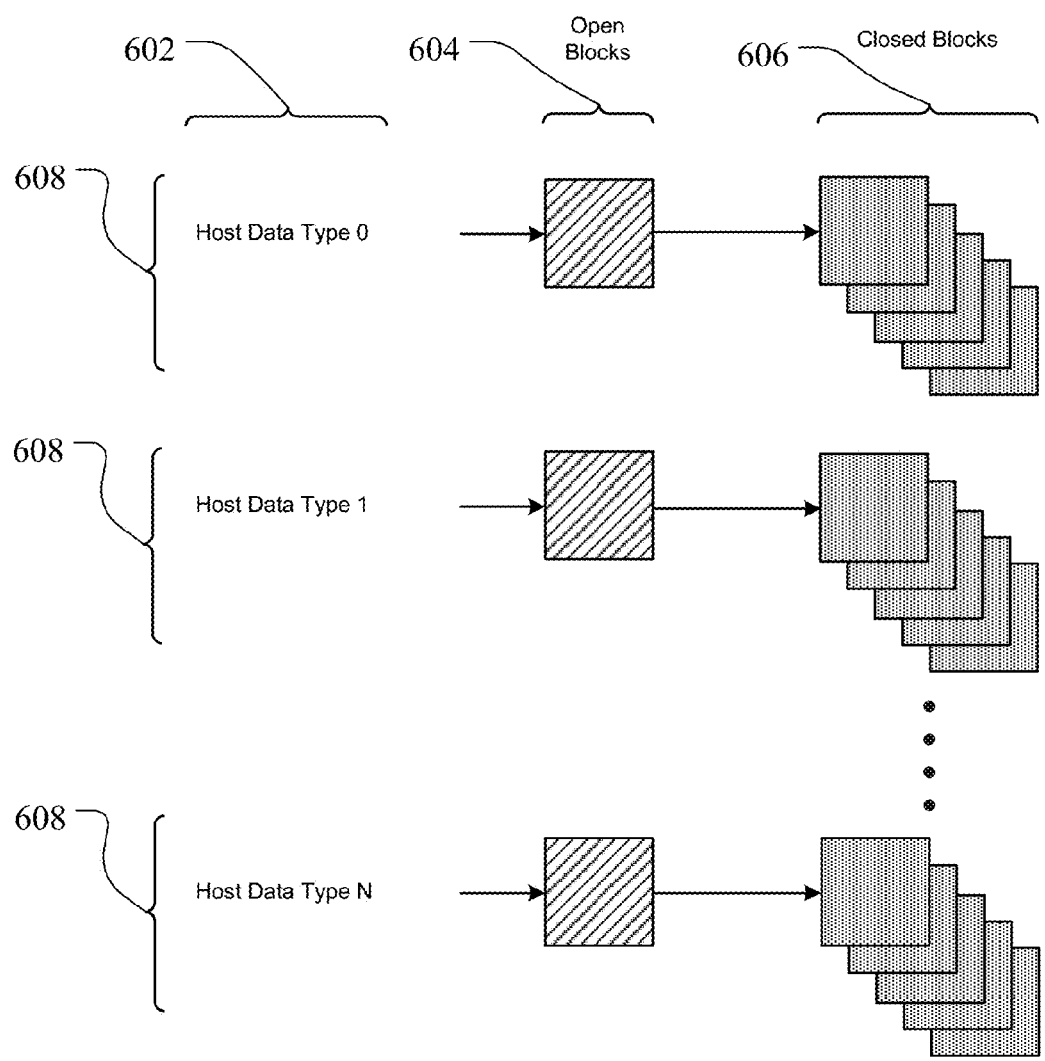
FIG. 6 illustrates an arrangement of multiple stratums for each of a plurality of different data types.

FIG. 6 illustrates an example layer of an independently managed non-volatile memory set that may have multiple stratums 608. Each stratum 608, as noted above, has an open host write block 604 designated to receive a different host data type 602. In FIG. 6, data associated with a host write command from the host to the non-volatile memory system 100 is routed to an open host write block 604 in the stratum 608 for the desired host data type and once an open host write block 604 is filled, it is placed in the collection of closed blocks 606 for that stratum 608. Any number of predetermined host data types 602 (Type 0-Type N) may be each provided with a separate stratum 608. In one implementation, each host data type predetermined to belong to a different stratum 608 is selected based on the probability of the host updating data of that type. For example, using a simplest case of two stratums 608 in a single layer of an independently managed set, a first stratum 608 may be associated with a data type identified as high frequency update data and a second stratum 608 may be identified as having data with a low frequency of host update. The high frequency update stratum may include random data, temporary data from browser software, and other data predetermined to have a higher than average likelihood of updates. In contrast, the lower frequency update stratum may include sequential data or data of certain file types predetermined to have a lower likelihood of host update. The non-volatile memory system 100 includes tracking parameters for capacity of a particular stratum 608 along with the maximum amount of valid data and the current actual amount of valid data assigned to the stratum. These parameters may be used to balance out overprovisioning of physical capacity between each stratum so that a certain performance level is maintained as described in greater detail below.

Figure 7:
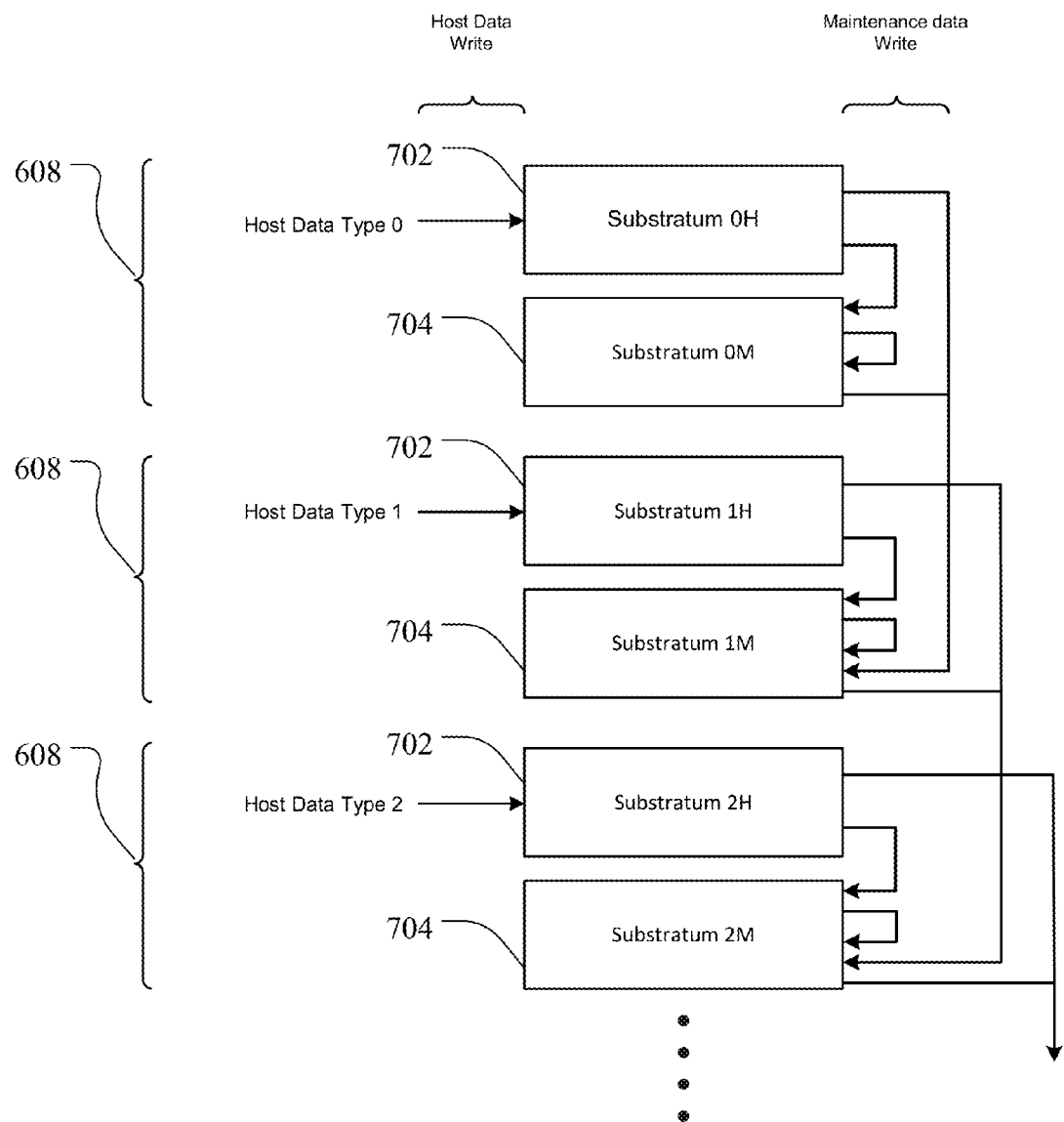
FIG. 7 illustrates a more detailed version of the stratums of FIG. 6 that includes a host data substratum and a maintenance data substratum for each stratum.

Referring to FIG. 7, the individual stratums 608 each may be conceptually divided into two substratums 702, 704, also referred to herein as subportions of the predetermined portions or stratums, to differentiate between original data received from the host and maintenance data that has either been relocated within the stratum or moved from one stratum to another stratum. The first of these two substratums, a host data substratum 702, may include the open host write block for the particular data type associated with the stratum and the closed host write blocks of that particular data type. The open relocation block for the stratum and the closed relocation blocks for the stratum would be in the maintenance data substratum 704. This substratum 702, 704 representation of each stratum 608 is useful in illustrating the movement of data within and between stratums.

For example, if a non-volatile memory system tracked three types of host data (Type 0, Type 1, and Type 2), the host data router in the non-volatile memory system may route data associated with those respective data types to the appropriate one of the stratums 608. Original host data received for each stratum would go to the host data substratum 702 of the respective stratum 608. If a maintenance operation is required, data from a stratum 608 is selected and may be moved, depending on the circumstances, from a host data substratum 702 to a maintenance data substratum 704 in the same stratum, within a same maintenance substratum, or from a maintenance data substratum of one stratum to a maintenance data substratum within a lower stratum. A lower substratum refers to a substratum associated with a next lower update frequency stratum in this example.

Assuming data of Type 0 is the data having the highest predetermined likelihood of host update, then after originally being routed to the host data substratum for host data type 0 stratum, any maintenance operation, such as garbage collection, of blocks with obsolete data and valid data would result in either relocating the valid data from the Type 0 host data substratum to the maintenance data substratum 704 in that stratum 608, from one block to another within the Type 0 maintenance data substratum 704, or from the Type 0 maintenance data substratum 704 to the maintenance data substratum 704 of the next lower stratum. In this case, the next lower stratum is the stratum for Type 1 host data. This downward motion of data moved from a host data substratum 702 to a maintenance data substratum 704 within a particular stratum, or to move from a maintenance data substratum of a higher update probability stratum to a maintenance substratum of a next lower probability update stratum would be repeated for each of the stratum until the lowest stratum (lowest update probability stratum in this example) is reached at which point that stratum would accumulate data in its maintenance substratum until full. Accordingly, although each stratum is configured so that only a particular type of host data is received in a host write, after a certain amount of operation, the substratum for maintenance data in each of the stratum may accumulate data from other data types originally written to other stratum that have been written to the relocation block in the stratum as the data become less active and been moved down. The host data substratum for each stratum will only maintain data of the originally designated data type, however.

Figure 8:
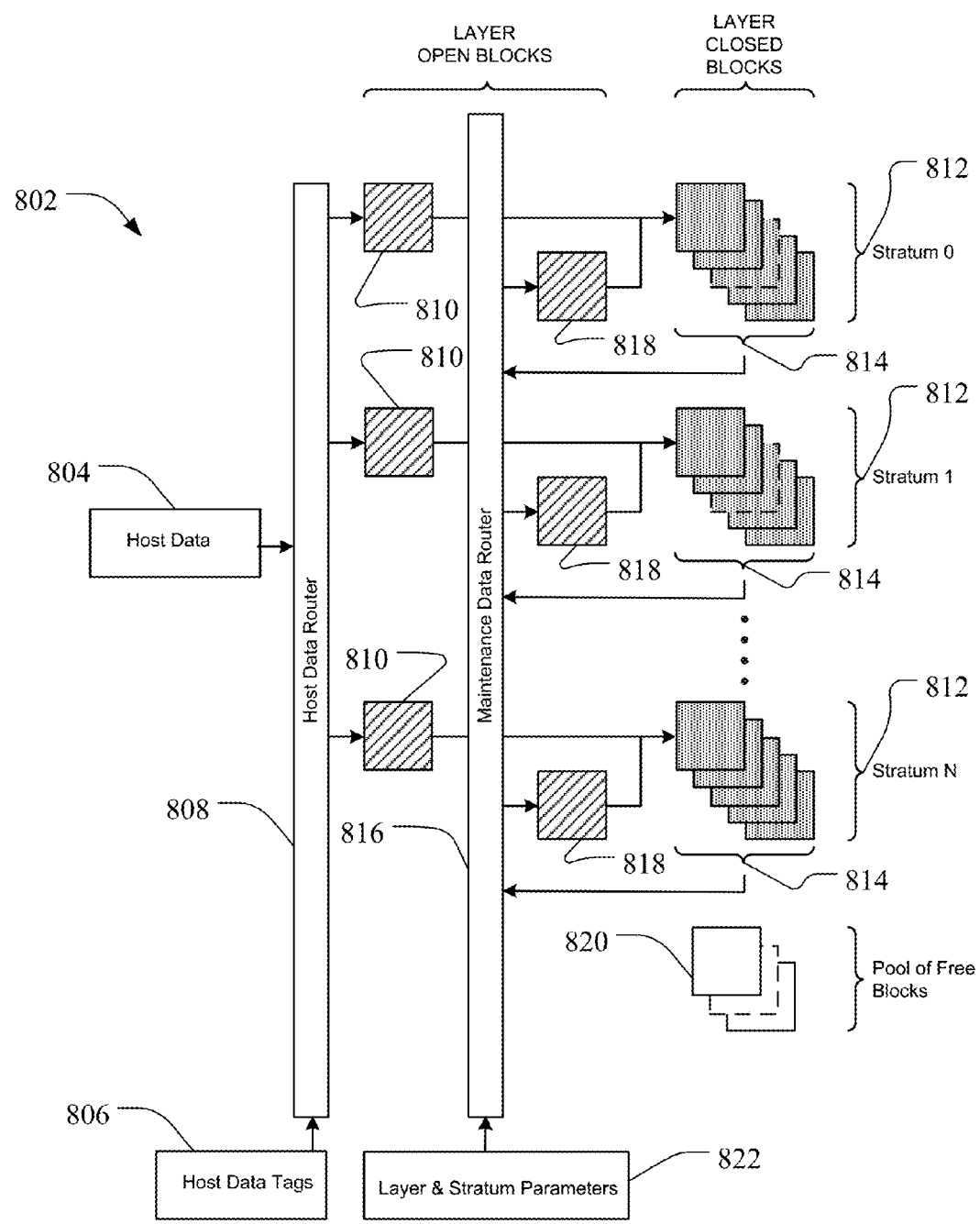
FIG. 8 is a block diagram showing an embodiment of data routing mechanisms of the system of FIG. 1A in relation to multiple stratums in a layer of an independently managed non-volatile memory set in the non-volatile memory.

As illustrated in FIG. 8, a more detailed version of the routing and maintenance process of data to and between a predetermined number N of stratums 812 in the non-volatile memory system 802 is illustrated. FIG. 8 shows multiple stratums 812 in a single layer of an independently managed non-volatile memory set of the non-volatile memory system. The independently managed set, as described above, may include one or more separate die across which the layer and stratums 812 extend. Host data 804 is received at the non-volatile memory system, along with host data tags 806 identifying the specific data type for that host data. The host data router 808, which corresponds to the host data router module 112 of FIG. 2A, of the non-volatile memory system will analyze the host data tag information from the host and direct the data from the host to the open host write block 810 for the stratum 812 associated with the appropriate host data type. Once an open host write block 810 is filled for a particular stratum 812, that block is placed in the closed block pool 814 for the stratum 812 in that layer.

The controller or host data router 808 of the non-volatile memory system 802 may be configured to recognize any of a number of data type tagging schemes. The data tag information 806 received from the host may include file identifier information and data type identifying information. Alternatively, the data tag information 806 may simply provide a data type tag to classify data that is about to be written by the host without providing any information relating the data to a particular host file. A data type tagging command recognizable by the non-volatile memory system 802 may be included as an extension to an interface protocol, may be implemented as reserved codes in a legacy LBA interface command set, and may be transmitted from the host to the non-volatile memory system via reserved or unallocated command codes in a standard communication interface. Examples of suitable interfaces include the ATA interface, for solid state disks, or ATA-related interfaces, for example those used in CF or SD memory cards. The host would only need to provide the data type tagging command during a write-related operation and it is contemplated that the data type tagging command would not normally be required when data is being read. In other implementations, the data type tagging command may be used in read operations to achieve faster read operations.

The data type tagging information received may include many parameters or only a single parameter. For example, the data type tagging command sent by the host may be: $tag <type>, where the <type> parameter indicates the data type of the next burst of data the host is sending out. The data type identified by this parameter may include information expressly labeling the data with a data type indicative of likelihood of future host update, or information that the non-volatile memory system can use to classify the data into different levels of likelihood of host update (for example, information on file extension such as .tmp, .pdf or etc., or on file size). One suitable data tagging format that may be used by a host and non-volatile memory system is set forth in U.S. Pat. No. 8,239,639.

Referring again to FIG. 7, the maintenance data router 816 or controller of the non-volatile memory system 802 will select a stratum 812 and a closed block from the closed block pool 814 in the stratum on which to perform a maintenance operation. The data will either be moved from the selected block to another block within the stratum 812 or to an open maintenance data block 818 in a next stratum 812. The decision as to which stratum 812 needs a maintenance operation and which block within the selected stratum is to be selected may be decided by the maintenance data router 816, which corresponds to the maintenance data router module 113 of FIG. 2A, based on layer and stratum parameters 822 which may be stored in non-volatile memory for the non-volatile memory system 102. In embodiments where each stratum 812 is subdivided into substratums 702, 704 such as shown in FIG. 7, data in the closed block pool 814 for the stratum 812 is divided between host data substratum blocks and maintenance data substratum blocks. The maintenance operation would then either be to move valid data from a block in the host data substratum 702 for a particular stratum 608 to the maintenance data substratum 704 of that same stratum 608, to move valid data between different blocks within the same maintenance data substratum, or to move valid data from a maintenance data substratum of the selected stratum to a maintenance data substratum in the next lower data type stratum, for example from Stratum 0 to Stratum 1 in FIG. 8.

The maintenance data router 816 may maintain an open maintenance block 818 in each stratum 812 for receiving data that has been moved from within the stratum or from another stratum and, when that open maintenance block 818 is fully programmed, will be placed into the closed block pool 814 for that stratum in the layer. The blocks freed in any of the stratums of the layer by the maintenance operation will be placed in a free block pool 820 for reuse by the controller and/or routers 808, 816 for addition to any of the stratum in that layer of the particular non-volatile memory die 104 in which the free block is generated.

FIGS. 6-8 illustrate a general direction of movement of data into and between the various stratums in a particular layer of an independently managed set. The non-volatile memory system, through different predetermined minimum capacity overprovisioning settings that differ for each stratum, takes advantage of this pattern of data movement to help avoid write amplification for higher update frequency data. For example, the non-volatile memory system may be configured at manufacture to include a predetermined amount of minimum physical capacity overprovisioning for each stratum where a stratum associated with a data type having a higher likelihood of update is allocated a larger minimum capacity overprovisioning than a stratum associated with data type having a lower frequency of update. The overprovisioning may be calculated in terms of a current physical capacity C for a stratum and a maximum amount of data ($D_{max}$) for that stratum such that the stratum will have a minimum physical capacity overprovisioning when the stratum contains the maximum amount of data permitted in that stratum.

In one embodiment, C associated with a particular stratum is dynamic and $D_{max}$ is set to a predetermined fixed percentage (fixed %) of C, such that $D_{max}$=(fixed %/100)×C, to achieve a minimum capacity overprovisioning for a stratum, where the fixed predetermined percentage (fixed %) may differ for each stratum. The minimum overprovisioning (OP) of physical capacity in each stratum may be calculated according to the relation: OP=C−$D_{max}$. This calculation differs for each stratum based on the primary relationship of $D_{max}$ to C. The parameters 822 for $D_{max}$ in each of the stratums, which permits the non-volatile memory system to maintain different amounts of overprovisioning in each predetermined stratum, may be stored in non-volatile memory in the non-volatile memory system or in non-volatile memory within a controller or other hardware circuit of the non-volatile memory system.

Figure 9:
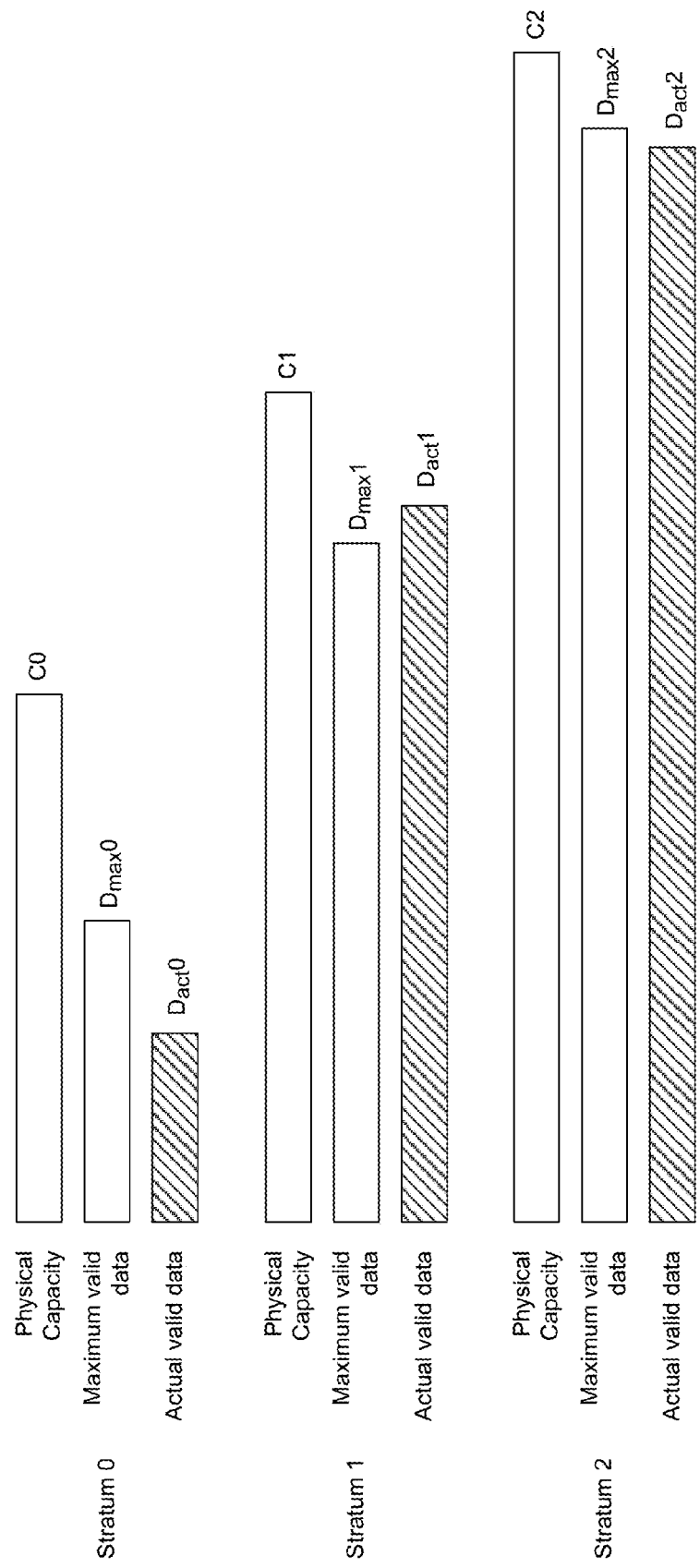
FIG. 9 illustrates an example relative minimum physical overcapacity setting for each substratum of one possible non-volatile memory system having a three substratum structure, and a current relative physical overcapacity status.

FIG. 9 illustrates an example of three stratums in a layer of an independently managed set in a non-volatile memory system. Stratum 0 is associated with incoming host data of a data type having a greatest likelihood of host update, Stratum 1 is associated with incoming host data of a second data type having a next greatest likelihood of host date after the data type of Stratum 0, and Stratum 2 is associated with incoming data of a data type having a least likelihood of host update. C0, C1 and C2 are the current gross physical capacities allocated to the three stratums. C0+C1+C2 is the fixed gross physical capacity for data storage in the layer (ignoring the small number of free blocks in the free block pool). The physical capacity of a stratum varies over time. Free blocks are added to a stratum as host write blocks or relocation blocks or closed blocks are erased in a stratum after a maintenance operation and returned to the common free-block pool 820.

$D_{max}$ 0, $D_{max}$ 1 and $D_{max}$ 2 are the maximum valid data contents of the three stratums. $D_{max}$ 0+$D_{max}$ 1+$D_{max}$ 2 are the fixed LBA capacity assigned to the layer. $D_{max}$ for a stratum is a fixed percentage of C for that stratum. The percentage is preferably preset to be different for different stratum. $D_{max}$ varies as C varies for each stratum. C–$D_{max}$ is the minimum overprovisioning in the stratum. $D_{act}$ is the current actual valid data content in a stratum. C–$D_{act}$ is the current overprovisioning in the stratum. $D_{act}$ can increase as data for new LBAs is written to the stratum. $D_{act}$ can decrease as data is overwritten by data for the same LBA in a different stratum or data for an LBA is trimmed by the host.

TABLE 1

Effect of Operation on Stratum Parameters

| Data Operation Type | C | $D_{max}$ | $D_{act}$ |
|---|---|---|---|
| Writing new data to stratum (from host, or by relocation from previous stratum) | Increased by amount of data written (average overtime) | Increased as a fixed % of increase in C | Increased by amount of data written |
| Trimming data (from host) | Unchanged | Unchanged | Decreased by amount of data trimmed |
| Relocation of data within same stratum | Decreased by amount of obsolete data in block being reclaimed | Decreased as a fixed % of decrease in C | Unchanged |
| Relocation of data to next stratum | Decreased by capacity of one block | Decreased as a fixed % of decrease in C | Decreased by amount of data relocated |

Referring now to Table 1, there are different data operations in a stratum based on where data write or maintenance operations originate. The operations in a stratum and their effect on capacity C, maximum data $D_{max}$, and the actual data $D_{act}$ are referred to in the data operation type descriptions. As noted above, when writing new data to a stratum from a host or relocating data to the stratum from a different stratum, the effect on the overall capacity of that destination stratum is to increase the physical capacity by the amount of data that is written. This is an average over time as new blocks are added and filled in stepwise manner such that a physical capacity of a new block is only added when a new block is needed and may not be triggered by a single particular data write of that data type. $D_{max}$ for that stratum would be increased by a fixed percentage of the increase in C based on the predetermined percentage of C allotted at manufacture for that stratum. The actual data $D_{act}$ would increase simply by the amount of data written. The controller 102 or control circuitry preferably tracks the amount of $D_{act}$ at a finer granularity than physical capacity C because $D_{act}$ changes in amounts less than a physical block.

In response to a trim command from a host indicating that certain logical addresses no longer contain valid data, there would be no change on the physical capacity C or $D_{max}$ for that stratum as the physical capacity remains but some of the data has become obsolete. $D_{act}$ for that stratum would be decreased by the amount of data trimmed. When the data operation type is a relocation of data within a same stratum, specifically the host data substratum to maintenance data substratum within a same stratum, the capacity C for that stratum would be decreased by an amount of obsolete data that is being reclaimed and the $D_{max}$ for that stratum would decrease by a fixed percentage of the decrease in C. The actual amount of valid data in that stratum based on the location of data in the same stratum would remain the same. The effect of relocation of data from the stratum to a next stratum would, for the source stratum, be a decrease in the capacity of the source stratum by one block and an associated percentage decrease of the maximum amount of data for that stratum. The actual data would change by the amount of data that was actually relocated from the source stratum.

The data operations generally outlined in Table 1 and described above, relate to a general flow of data when a particular operation is initiated. In order to maintain the minimum overprovisioning of physical capacity set for each stratum, a method for maintaining this required minimum overprovisioning is defined. The method is based on selection of the type of maintenance operation which should be performed next and the stratum in which it should be performed. The adjustment of overprovisioning of physical capacity is addressed upon the initiation of a maintenance operation.

Figure 10:
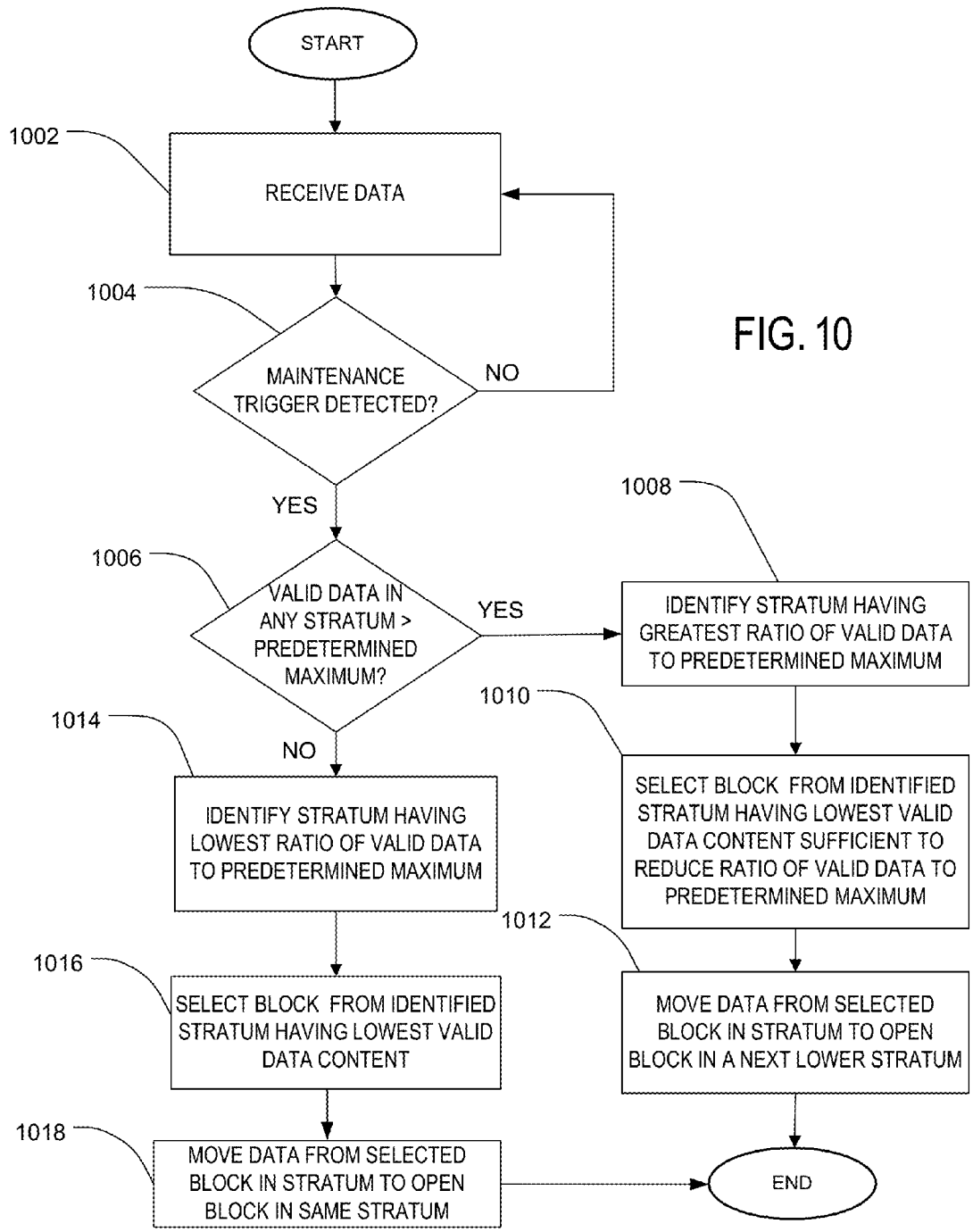
FIG. 10 is a flow chart of one implementation of a method for managing multiple stratums in a layer within an independently managed non-volatile set of a non-volatile memory system such as shown in FIG. 1A.

Referring to FIG. 10, one embodiment of a process is illustrated for maintaining different stratums having initial host data of a particular data type, and of optimizing performance of a non-volatile memory system having such stratums by dynamically managing physical capacity overprovisioning to achieve greater overcapacity of stratums with data having higher likelihood of host update. The process may be initiated in the normal course of non-volatile memory system operation, for example while the non-volatile memory system is receiving or prepared to receive host data, by detecting the need for a maintenance operation (at 1002, 1004). The trigger for a maintenance operation may be either when a number of blocks in the free block pool for a layer in an independently managed set on the non-volatile memory system falls below a minimum value or may be satisfaction of background maintenance operation criteria which may initiate regardless of a particular free block availability and instead initiate to take advantage of times when the non-volatile memory system is not receiving commands from the host.

If a maintenance trigger is detected, whether due to a dropping of the free block pool below a threshold or satisfying criteria for starting a background operation, then the controller and/or maintenance data router may analyze whether the amount of valid data ($D_{act}$) in any stratum is greater than the $D_{max}$ for that stratum (at 1006). If a stratum is identified having an amount of valid data greater than the $D_{max}$ for that stratum then that stratum is selected for identifying a block for relocation. If the memory module has more than one stratum above its predetermined maximum valid data threshold then the controller would identify the stratum having the greatest ratio of valid data to predetermined maximum and select that stratum from which to analyze blocks for relocation (at 1008). After identifying the appropriate stratum, a block from that stratum would be identified as having the lowest amount of valid data content sufficient to reduce the ratio of valid data ($D_{act}$) to the predetermined maximum ($D_{max}$) (at 1010).

Thus, the amount of valid data needed in the selected block to reduce this ratio may be determined by referring again to the relationship between C and $D_{max}$, for each layer. Because $D_{max}$=(fixed %/100)×C, then a 1 block reduction in C for a stratum as a result of a maintenance operation reduces $D_{max}$ by a fixed percentage of the block. If the amount of valid data in the selected block is designated as a percentage of the data in the block (V %), then the reduction in the actual amount of data $D_{act}$=V % of a block. Accordingly, for a reduction in the ratio of $D_{act}$ to $D_{max}$, the amount of valid data (V %) in the selected source block must be greater than the percentage reduction in $D_{max}$ (fixed %) caused by the reduction of C by 1 block in the maintenance operation. In one embodiment, the block selected for the maintenance operation preferably has a percentage of valid data (V %) greater than the value fixed % for the selected stratum. In one implementation this may be accomplished by selecting the block with the lowest percentage of valid data greater than $D_{max}$/C×100. Stated a different way, the maintenance data router 113 may select the block that will change the actual amount of valid data $D_{act}$ in the stratum a minimum number of pages greater than the change in $D_{max}$ for the stratum. Once the block is selected meeting the appropriate criteria, data from that block would be moved from the stratum to a new or open block in a next lower update frequency stratum and the freed block is moved to the free block pool for the layer in the non-volatile memory system (at 1012).

If after detecting the maintenance trigger there was no stratum that currently had more valid data than its predetermined maximum, then the controller may identify the stratum having the lowest ratio of valid data to the predetermined maximum (at 1006, 1014). The maintenance data router 113 would select a block from that identified stratum with the highest amount of obsolete data (lowest amount of valid data) as the source block for the maintenance operation (at 1016). In this instance, the data from the selected block would be moved to another block (e.g. an open maintenance block for the stratum) within the same stratum (at 1018). This will result in reducing C by freeing a block for the free block pool from that stratum so that the actual overprovisioning in that stratum will go down and allow for the overprovisioning to be increased in another stratum that may need it.

Referring again to FIG. 9, and the hypothetical three stratum in a layer arrangement in a non-volatile memory illustrated there, a physical capacity, maximum valid data setting and actual valid data amount at a given point in time is shown. The higher probability host update data is in stratum 0 and the lowest probability update data type is in stratum 2. As illustrated, the higher update probability data type in Stratum 0 has a fixed percentage difference between $D_{max}$ and C for that stratum greater than the percentage difference between $D_{max}$ and C of the lower two stratum (Stratum 1 and Stratum 2). This difference between $D_{max}$ and C represents the overprovisioning, or the extra physical capacity as compared to the maximum data capacity. True overprovisioning (current physical capacity overprovisioning) at any instant of time of physical capacity is of course the difference between the physical capacity and the actual valid data $D_{act}$ of the particular stratum. Thus, the maximum valid data to physical capacity ratio represents a minimum overcapacity that is being set and each stratum would typically be operating in a higher overprovisioning capacity than the minimum.

In the hypothetical example of FIG. 9, if a maintenance trigger was detected, then Stratum 1 would be selected according to the method of FIG. 10 as the source stratum for a block to use in a maintenance operation. This would be because the actual data $D_{act}$1 of Stratum 1 exceeds the maximum valid data $D_{max}$ 1 set for that stratum. The maintenance operation for the scenario illustrated in FIG. 10 would be to move the valid data from the host data substratum to the maintenance data substratum, or from one location to another location within the maintenance substratum, in Stratum 1. It should be noted that the last stratum, Stratum 2, in the chain of stratum in FIG. 9 cannot perform a maintenance operation to relocate data to another stratum. However, this last stratum has the lowest of the preset overprovisioning values (the difference between C and $D_{max}$) which is maintained automatically if the other strata do not exceed their preset values. If the non-volatile memory system 102 includes additional layers, then the last stratum in a layer may relocate data to a stratum in a next layer of the non-volatile memory system.

A system and method have been described for managing pools of blocks in a layer of an independently managed non-volatile memory set in a non-volatile memory system in order to allow the non-volatile memory system to manage overprovisioning of physical capacity to favor data in stratum having a greater likelihood of host update. Operations to write data and trim data which are initiated by the host can continue indefinitely in the multiple stratums in a storage layer, because of typical maintenance operations which operate to provide free space for writing new host data. The physical capacity allocated to each of the stratum varies dynamically according to the distribution of data written and trimmed by the host amongst all strata. Minimum overprovisioning of physical capacity in each stratum is fixed, and is predefined. A method for maintaining the required minimum overprovisioning in each stratum is defined based on selection of the type of maintenance operation which should be performed next, the stratum in which it should be performed and the particular block in the selected stratum for completing the maintenance operation.

In the above discussion, semiconductor storage systems and modules such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but covers all relevant memory structures within the spirit and scope of the invention as described herein and as understood by one of skill in the art.

I claim:

1. A method for managing maintenance procedures in an independently managed non-volatile memory set of a non-volatile memory, the method comprising:
   receiving data associated with a data write command from a host;
   identifying which of a plurality of data types the received data is associated with based on data type information received from the host;
   storing the received data having the identified data type in a predetermined portion of the independently managed non-volatile memory set, the independently managed non-volatile memory set having a group of non-volatile memory cells of a same storage density, wherein the group of non-volatile memory cells comprises a plurality of predetermined portions, each of the predetermined portions having an open host write block associated with only a respective one of the plurality of data types;
   detecting a maintenance operation trigger;
   in response to detecting the maintenance operation trigger:

selecting one of the plurality of predetermined portions in which to execute a maintenance operation based on a respective physical capacity overprovisioning criteria associated with each of the plurality of predetermined portions;

executing the maintenance operation on a block of the selected predetermined portion to adjust physical capacity overprovisioning of the selected predetermined portion to meet the physical capacity overprovisioning criteria for the selected predetermined portion; and wherein when at least one of the plurality of predetermined portions has more valid data than a predetermined maximum amount of data:

selecting one of the plurality of predetermined portions comprises selecting a predetermined portion having a greatest ratio of valid data to a predetermined maximum amount of valid data;

and executing the maintenance operation comprises moving valid data from a block from the selected predetermined portion to a different predetermined portion.

2. The method of claim 1, wherein moving valid data from the block from the selected predetermined portion comprises first selecting the block in the selected predetermined portion having an amount of valid data necessary to reduce a ratio of actual valid data relative to a maximum amount of valid data for the selected predetermined portion.

3. The method of claim 1, wherein selecting the predetermined portion comprises, when no predetermined portion has an amount of valid data greater than a predetermined maximum amount of valid data for that predetermined portion, selecting the predetermined portion having a lowest ratio of actual valid data to the predetermined maximum amount of valid data for that predetermined portion.

4. The method of claim 3, wherein executing the maintenance operation comprises selecting a block in the selected predetermined portion, the selected block having a least amount of valid data of blocks in the selected predetermined portion.

5. The method of claim 4, wherein executing the maintenance operation further comprises moving valid data from the selected block from the selected predetermined portion to a different block in the selected predetermined portion and moving a block freed by the maintenance operation from the selected predetermined portion to a free block pool.

6. A non-volatile memory system comprising:

an independently managed non-volatile memory set having a plurality of predetermined portions in a layer of the independently managed non-volatile memory set, where the layer comprises blocks of memory cells having a same bit per cell storage capacity and each predetermined portion is defined by an open host write block exclusively associated with a data type that differs from each other of the plurality of predetermined portions;

a host data router in communication with the plurality of predetermined portions and configured to route data received from a host to one of the plurality of predetermined portions based on the data type of the data received from the host;

a maintenance data router in communication with the plurality of predetermined portions, the maintenance data router configured to adjust a current physical capacity overprovisioning in at least one predetermined portion in response to detecting a maintenance operation trigger, wherein current physical capacity overprovisioning comprises a relation of a current physical data storage capacity associated with a particular predetermined portion to a current amount of valid data associated with the particular predetermined portion; and wherein the maintenance data router is configured to, in response to detecting the maintenance operation trigger, identify a predetermined portion having a highest ratio of actual valid data above a predetermined maximum amount of valid data for the identified predetermined portion, and to move valid data from the identified predetermined portion to a different predetermined portion.

7. The non-volatile memory system of claim 6, wherein the data type for each predetermined portion identifies data having a frequency of expected data update.

8. The non-volatile memory system of claim 6, wherein the plurality of predetermined portions comprise a first predetermined portion associated with data having a high expected update frequency and a second predetermined portion associated with data having a low expected update frequency.

9. The non-volatile memory system of claim 6, wherein the host data router is configured to recognize the data type of received data from a host data tag received from the host.

10. The non-volatile memory system of claim 6, where the non-volatile memory system is embedded in the host.

11. The non-volatile memory system of claim 6, where the non-volatile memory system is removably connectable to the host.

12. The non-volatile memory system of claim 6, wherein to move valid data from the identified predetermined portion to the different predetermined portion the maintenance data router is further configured to select a block, in the identified predetermined portion, having an amount of valid data necessary to reduce a ratio of actual valid data relative to the predetermined maximum amount of valid data for the identified predetermined portion.

13. The non-volatile memory system of claim 12, wherein the maintenance data router is further configured to move a block freed from the identified predetermined portion to a free block pool.

14. The non-volatile memory system of claim 6, wherein the maintenance data router is configured to adjust the overprovisioning by, when no predetermined portion has an amount of valid data greater than a predetermined maximum amount of valid data for that predetermined portion, selecting for a maintenance operation a predetermined portion having a lowest ratio of actual valid data to the predetermined maximum amount of valid data for that predetermined portion.

15. The non-volatile memory system of claim 14, wherein the maintenance data router is configured to select a block in the selected predetermined portion having a least amount of valid data of blocks in the selected predetermined portion.

16. The non-volatile memory system of claim 15, wherein the maintenance data router is further configured to moving valid data from the selected block of the selected predetermined portion to a different block in the selected predetermined portion and to move a block freed by the maintenance operation from the selected predetermined portion to a free block pool.

17. A non-volatile memory system comprising:

an independently managed non-volatile memory set having a plurality of predetermined portions in a single group of the non-volatile memory, where the single group comprises blocks of memory cells having a same bit per cell storage capacity, and wherein each predetermined portion includes an open host write block exclusively associated with a data type that differs from a data type of an open host write block of each other of the plurality of predetermined portions;

a host data router configured to identify a data type of host data and route host data having the identified data type to a host data subportion in one of the plurality of predetermined portions having an open host write block exclusively associated with the identified data type; and a maintenance data router having a first mode wherein the maintenance data router is configured to move data from a host data subportion to a maintenance data subportion in a same predetermined portion, and a second mode, wherein the maintenance data router is configured to move data from the maintenance data subportion in a first predetermined portion to a maintenance data subportion in a second predetermined portion associated with a data type of data having a lower probability of update.

* * * * *